(12) United States Patent
Bae (10) Patent No.: US 6,301,189 B1
(45) Date of Patent: Oct. 9, 2001

(54) APPARATUS FOR GENERATING WRITE CONTROL SIGNALS APPLICABLE TO DOUBLE DATA RATE SDRAM

(75) Inventor: Sung-Hoo Bae, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/604,686

(22) Filed: Jun. 27, 2000

(30) Foreign Application Priority Data

Jun. 28, 1999 (KR) .................................................. 99-24983

(51) Int. Cl.⁷ ....................................................... G11C 8/00
(52) U.S. Cl. ............................................. 365/233; 365/193
(58) Field of Search ..................................... 365/233, 193

(56) References Cited

U.S. PATENT DOCUMENTS

| 5,347,491 | 9/1994 | Kagami ................................. 365/222 |
| 5,430,684 | 7/1995 | Kim et al. .......................... 365/230.01 |
| 5,732,024 | 3/1998 | Sharma et al. .................... 365/189.05 |
| 5,802,555 | 9/1998 | Shigeeda .............................. 711/106 |
| 5,812,492 | * 9/1998 | Yamauchi et al. ................ 365/233.5 |
| 5,831,927 | 11/1998 | Casper et al. ..................... 365/230.06 |
| 5,903,916 | 5/1999 | Pawlowski et al. ................. 711/167 |
| 5,926,434 | * 7/1999 | Mori ..................................... 365/233 |

FOREIGN PATENT DOCUMENTS

| 3-113891 | 5/1991 | (JP) ............................ G11C/11/406 |
| 4-76886 | 3/1992 | (JP) ............................ G11C/11/403 |
| 5-234370 | 9/1993 | (JP) ............................ G11C/11/401 |
| 5-242670 | 9/1993 | (JP) ............................ G11C/11/401 |
| 6-215559 | 8/1994 | (JP) ............................ G11C/11/401 |
| 7-78468 | 3/1995 | (JP) ............................ G11C/11/406 |
| 10-275499 | 10/1998 | (JP) ............................ G11C/29/00 |

\* cited by examiner

*Primary Examiner*—David Nelms
*Assistant Examiner*—M. Tran
(74) *Attorney, Agent, or Firm*—Jacobson Holman, PLLC (57) ABSTRACT

An apparatus for generating internal write control signals applicable to a double data rate SDRAM, includes: a first unit for receiving write command signals to generate a write standby signal and an initial column address strobe (CAS) active signal, wherein the write command signal includes a row address strobe (RAS) signal, a column address strobe (CAS) bar signal, a write enable (WE) bar signal, and a chip select (CS) bar signal; a second unit for receiving the write standby signal to generate an input path enable signal; a third unit for receiving the initial CAS (column address strobe) active signal to generate a write CAS active signal and a write shield bar signal; a fourth unit for receiving the write command signals and the write shield bar signal to generate a precharge shield bar signal and a read shield bar signal, wherein the precharge shield bar signal is fed back to an input terminal of the fourth unit and is inputted as another input signal of the second unit; and a fifth unit for receiving the write shield bar signal and the read shield bar signal to generate an internal CAS active signal.

17 Claims, 11 Drawing Sheets

APPARATUS FOR GENERATING WRITE CONTROL SIGNALS APPLICABLE TO DOUBLE DATA RATE SDRAM

FIELD OF THE INVENTION

The present invention relates to a synchronous memory device; and, more particularly, to an apparatus for generating write control signals applicable to double data rate SDRAM.

DESCRIPTION OF THE PRIOR ART

For achieving a high speed of operation in a dynamic random access memory (DRAM), synchronous DRAM (SDRAM) has been developed which operates in synchronization with an external clock signal. The SDRAM includes a single data rate (SDR) SDRAM, and a double data rate (DDR) SDRAM.

Figure 1:
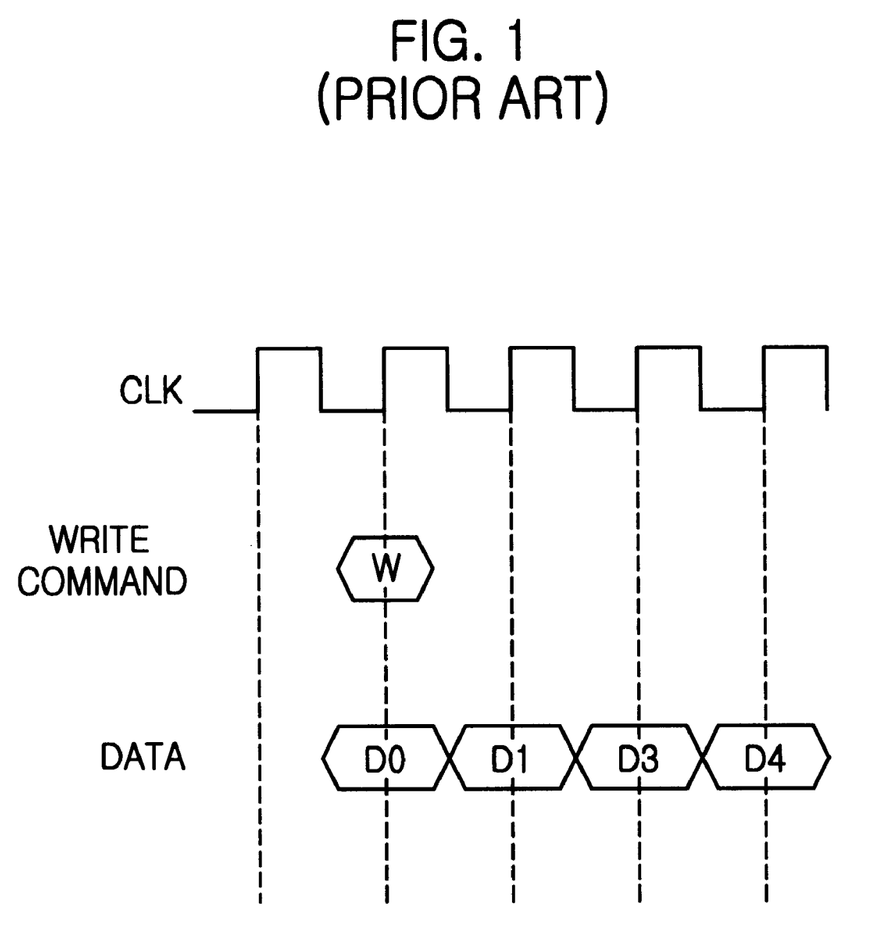
FIG. 1 is a timing chart showing a scheme of a SDR SDRAM.

In FIG. 1, there is shown a timing chart of a scheme of SDR SDRAM in a write mode.

As shown, when a write command is generated, the SDR SDRAM takes in one data in synchronization with rising edge of the external clock signal CLK, so that one data is processed during one period of the external clock signal CLK. Therefore, in order to achieve faster operating speed in the SDR SDRAM, an external clock speed should be increased. However, in that case, operating speed of memory device and other devices using the external clock signal should be also increased according to the increased external clock signal.

Figure 2:
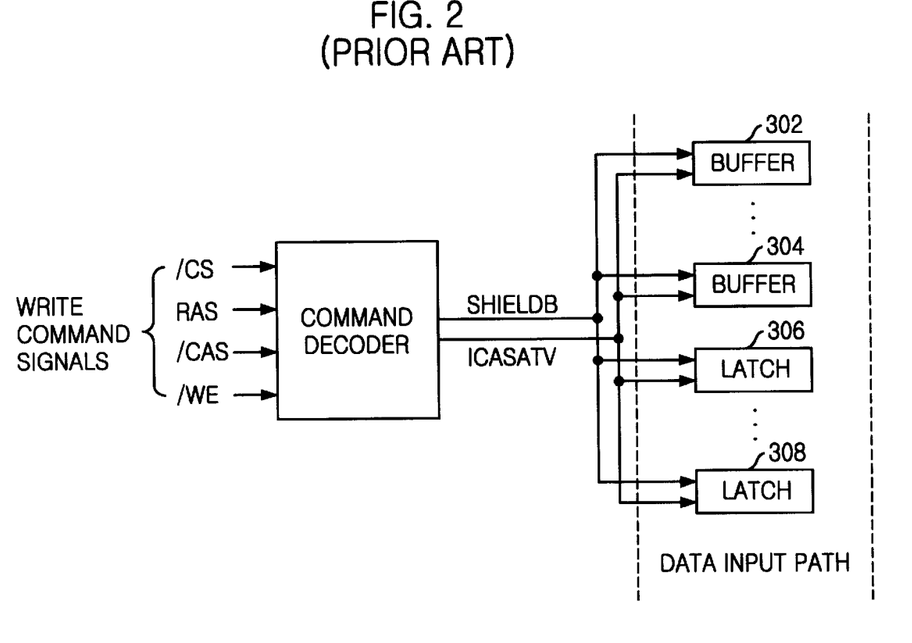
FIG. 2 is a block diagram of a write command decoder and units disposed on a data input path in a SDR SDRAM.

In FIG. 2, there is shown a block diagram of a write command decoder and units disposed on a data input path in a SDR SDRAM.

As shown, a write command decoder 300 receives write command signals from an external circuit. The write command signals include a chip select bar signal /CS, a row address strobe signal /RAS, a column address strobe bar signal /CAS, and a write enable bar signal /WE. The write command decoder 300 decodes the write command signals to generate internal write control signals, i.e., a CAS active signal ICASATV and a shield bar signal SHIELDB. The CAS active signal ICASATV is used to activate a data input path, and the shield bar signal SHIELDB is used to shield, or stop, a current write operation in response to an external interrupt.

A plurality of units such as buffer units 302 and 304 and latch units 306 and 308, disposed on the data input path, are activated or inactivated in response to the internal write control signals. However, the shield bar signal SHIELDB should be inputted to all units using the CAS active signal ICASATV, resulting in an increase of chip size.

Figure 3:
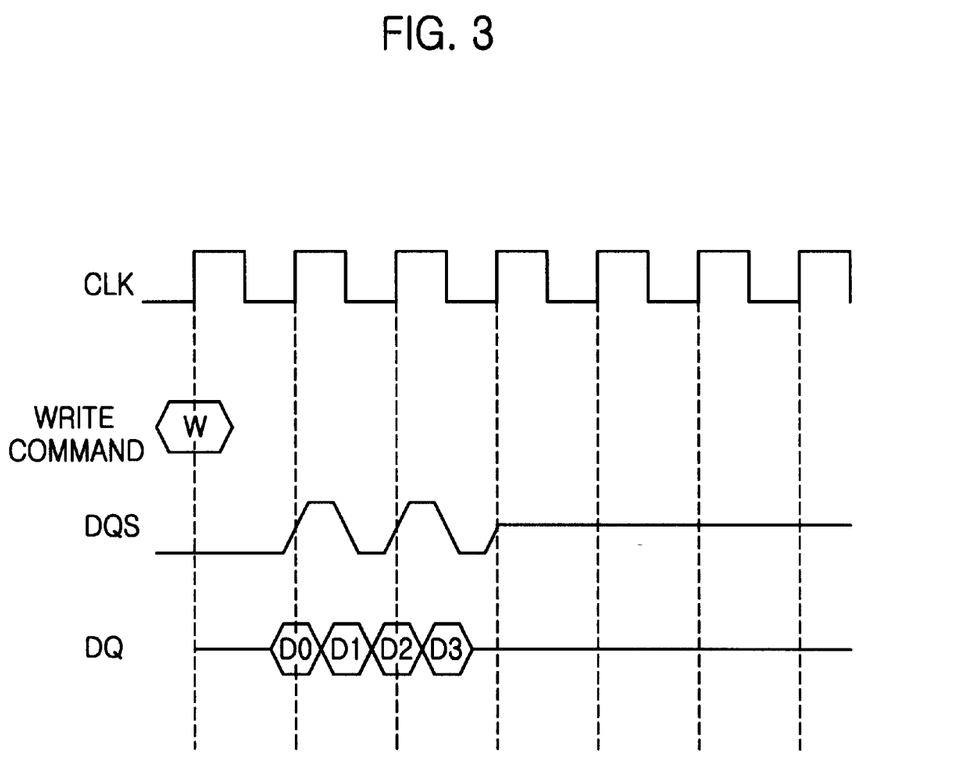
FIG. 3 is a timing chart showing a scheme of a DDR SDRAM.

In FIG. 3, there is shown a timing chart of a scheme of DDR SDRAM in a write mode.

As shown, unlike the SDR SDRAM, the DDR SDRAM takes in two data in synchronization with both rising and falling edges of a data strobe signal DQS, which is different from an external clock signal CLK. As a result, the DDR SDRAM can process two data during one period of the external clock signal CLK, thereby increasing an operation speed.

For the scheme of the DDR SDRAM, additional write control signals are needed. However, there is problems that the conventional write command decoder shown in FIG. 2 cannot apply to the DDR SDRAM, so that there is a demand for a write command decoder applicable to the data input path of the DDR SDRAM.

SUMMARY OF THE INVENTION

It is, therefore, an object of the present invention to provide an apparatus for generating write control signals applicable to double data rate SDRAM.

In accordance with an aspect of the present invention, there is provided an apparatus for generating internal write control signals applicable to a double data rate SDRAM, comprising: a first means for receiving write command signals to generate a write standby signal and an initial column address strobe (CAS) active signal, wherein the write command signal includes a row address strobe (RAS) signal, a column address strobe (CAS) bar signal, a write enable (WE) bar signal, and a chip select (CS) bar signal; a second means for receiving the write standby signal to generate an input path enable signal; a third means for receiving the initial CAS (column address strobe) active signal to generate a write CAS active signal and a write shield bar signal; a fourth means for receiving the write command signals and the write shield bar signal to generate a precharge shield bar signal and a read shield bar signal, wherein the precharge shield bar signal is fed back to an input terminal of the fourth means and is inputted as another input signal of the second means; and a fifth means for receiving the write shield bar signal and the read shield bar signal to generate an internal CAS active signal.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 4:
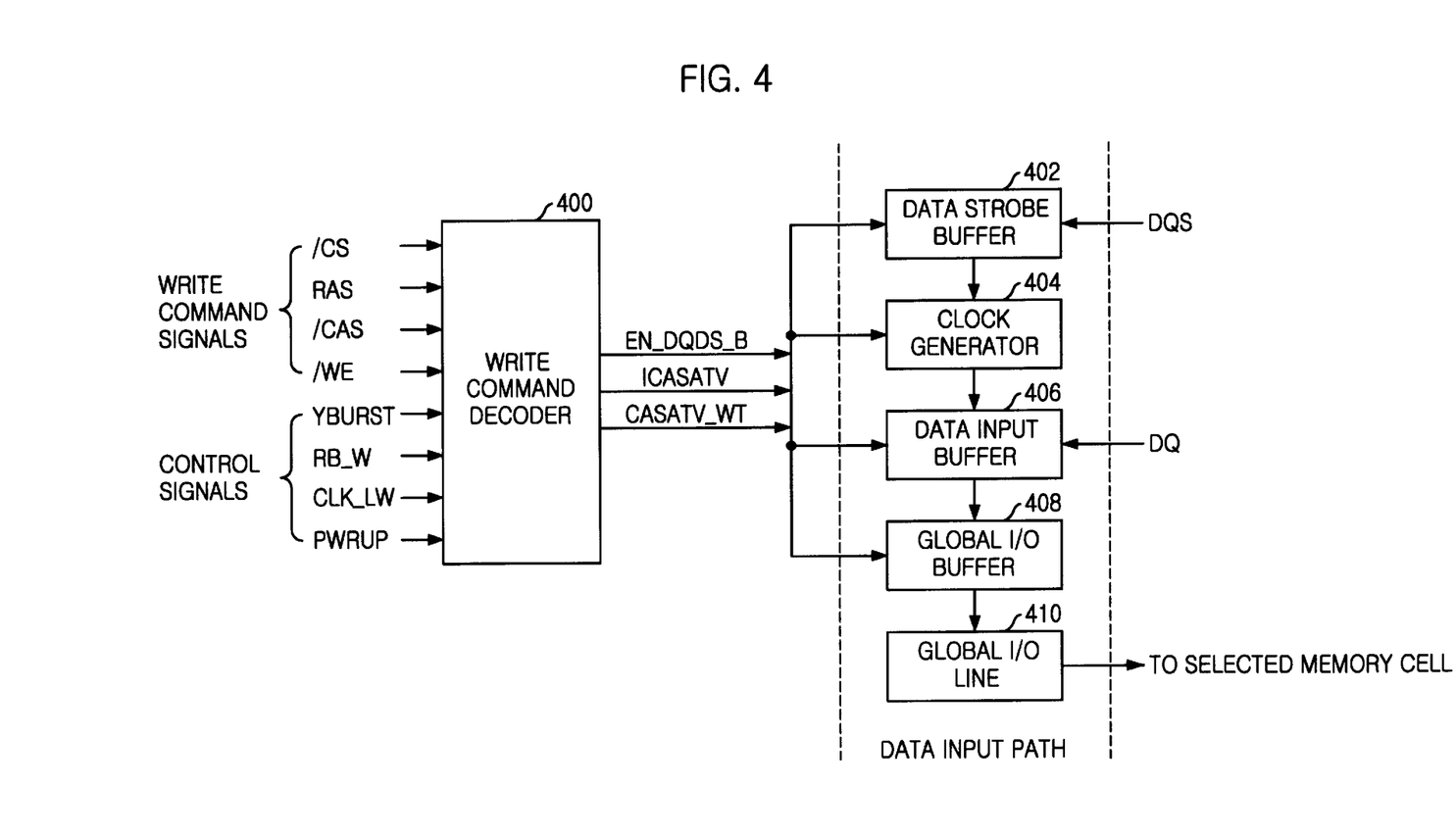
FIG. 4 is a block diagram of a write command decoder and units disposed on a data input path in a DDR SDRAM in accordance with the present invention.

In FIG. 4, there is shown a block diagram of a command decoder and units disposed on a data input path in a DDR SDRAM.

As shown, a command decoder 400 receives write command signals and control signals and decodes the write command signals and the control signals to generate internal write control signals.

The write command signals include a chip select bar signal /CS, a row address strobe signal RAS, a column address strobe bar signal /CAS, and a write enable bar signal /WE. At this time, in case where all of the four write command signals are high, a write operation is carried out.

The control signals include a column burst signal YBURST, a write control signal RB_W, a control clock signal CLK_LW, and a power up signal PWRUP.

The internal write control signals include an input path enable signal EN_DQDS_B, an internal CAS active signal ICASATV, and a write CAS active signal CASATV_WT.

A plurality of units disposed on a data input path is controlled by the internal write control signals. The plurality of the units include a data strobe buffer 402, a clock generator 404, a data input buffer 406, a global I/O (input/output) buffer 408, and a global I/O data line 410.

The data strobe buffer 402 buffers a data strobe signal DQS. The clock generator 404 receives a buffered data strobe signal from the data strobe buffer 402 to generate a clock signal. The data input buffer 406 receives an external data DQ to output a buffered data. The global I/O buffer 408 temporarily stores the buffered data from the data input buffer 406 and transfers the buffered data to the global I/O data line 410. The buffered data is transferred to a selected memory cell through the global I/O data line 410.

At this time, since units for generating the write command signals and the control signals are well known to those skilled in the art, a detail description of the units will be omitted.

Figure 5:
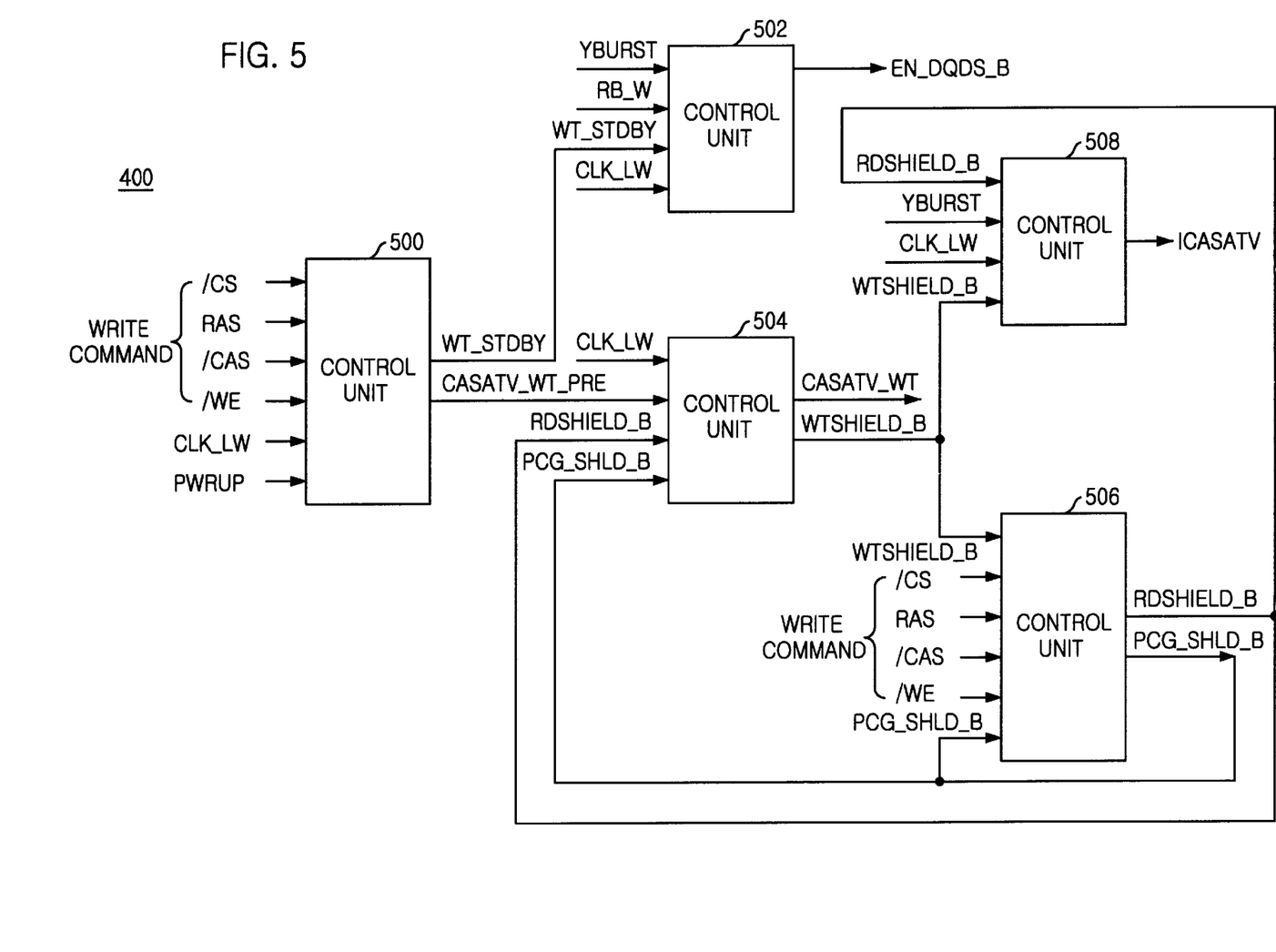
FIG. 5 is a block diagram illustrating a write command decoder shown in FIG. 4.

FIG. 5 is a block diagram illustrating a write command decoder in accordance with the present invention.

Referring to FIG. 5, the write command decoder 400 in accordance with the present invention includes five control signal generating units.

A first control signal generating unit 500 receives the write command signals, the control clock signal CLK_LW, and a power up signal PWRUP, to generate a write standby signal WT_STDBY and an initial CAS active signal CASATV_WT_PRE.

A second control signal generating unit 502 receives the write standby signal WT_STDBY from the first control signal generating unit 500, the control clock signal CLK_LW, the column burst signal YBURST, and the write control signal RB_W, to generate an input path enable signal EN_DQDS_B.

The third control signal generating unit 504 receives the initial CAS active signal CASATV_WT_PRE from the first control signal generating unit 500, a control clock signal CLK_LW, a read shield bar signal RDSHIELD_B, a precharge shield bar signal PCG_SHLD_B, to generate a write CAS active signal CASATV_WT and a write shield bar signal WTSHIELD_B.

The fourth control signal generating unit 506 receives the write shield bar signal WTSHIELD_B from the third control signal generating unit 504, the precharge shield bar signal PCG_SHLD_B and the write command signals, to generate the read shield bar signal RDSHIELD_B and the precharge shield bar signal PCG_SHLD_B.

The fifth control signal generating unit 508 receives the read shield bar signal RDSHIELD_B from the fourth signal generating unit 506, the column burst signal YBURST, the control clock signal CLK_LW, and the write shield bar signal WTSHIELD_B from the third control signal generating unit 504, to generate an internal CAS active signal ICASATV.

At this time, the write standby signal WT_STDBY is a signal used to generate the input path enable signal EN_DQDS_B. The input path enable signal EN_DQDS_B is used to enable buffers relating to a write operation only in a write mode, so that a current consumption is reduced. The write CAS active signal CASATV_WT is used to inform that a write operation begins.

The read shield bar signal RDSHIELD_B is used to shield a generation of the write CAS active signal CASATV_WT and the internal CAS active signal ICASATV when an interrupt due to read command signals occurs.

The write shield bar signal WTSHIELD_B is used to shield a write or read operation by preventing the internal CAS active signal ICASATV from being generated when current write or read operation is interrupted due to another write command signals.

The precharge shield bar signal PCG_SHLD_B is used to precharge the read shield bar signal RDSHIELD_B and the write shield bar signal WTSHIELD_B after a write operation.

FIGS. 6 to 10 are circuit diagrams illustrating each of the control signal generating units shown in FIG. 5, respectively. FIG. 11 is a timing chart of control signals in the write command decoder in accordance with the present invention.

Figure 6:
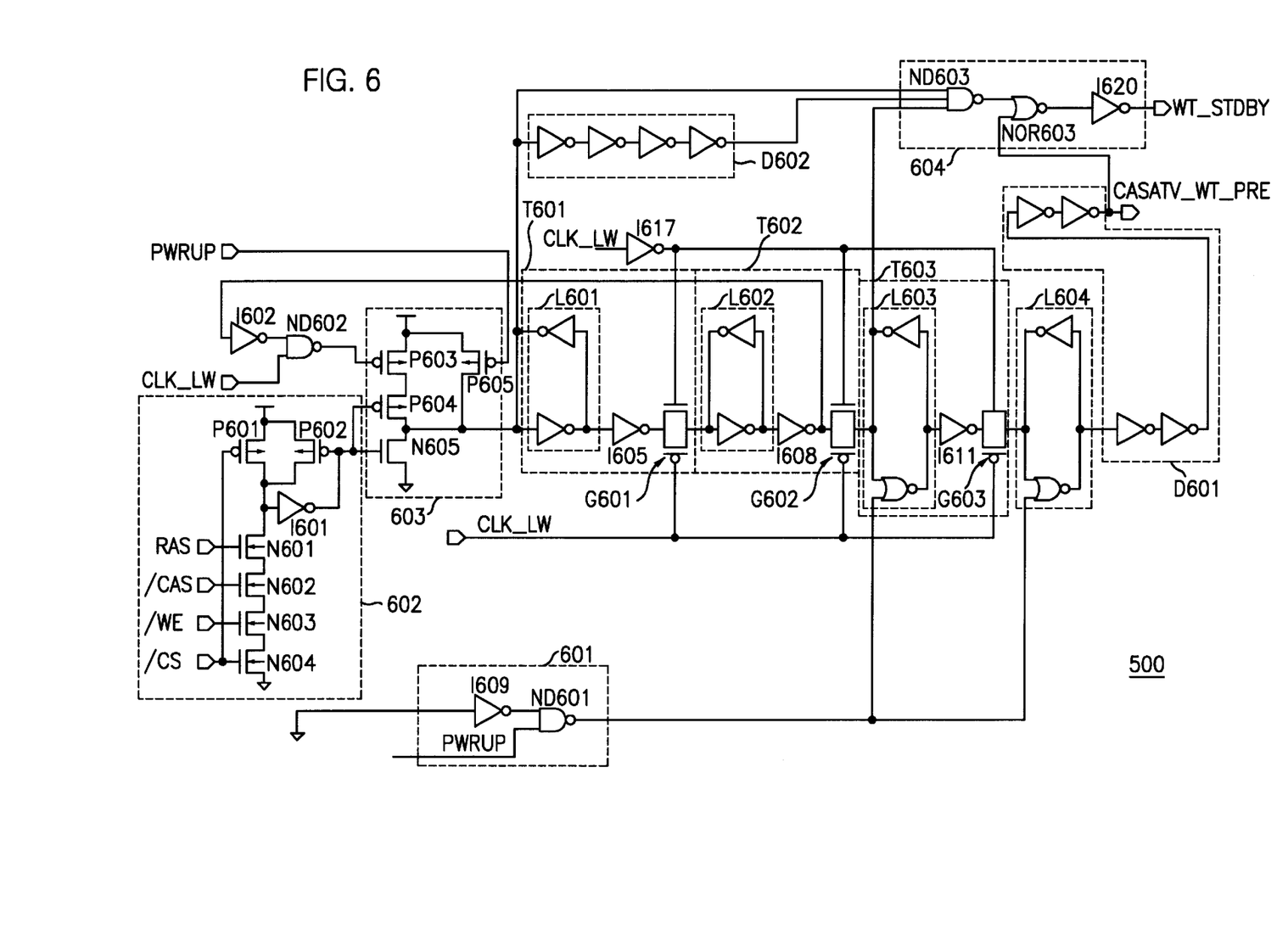
FIG. 6 is a circuit diagram illustrating a first control unit shown in FIG. 5.

In FIG. 6, there is shown a circuit diagram of a first control signal generating unit 500 shown in FIG. 5.

Referring to FIG. 6, the first control signal generating unit 500 includes a power signal transfer portion 601, a write command input portion 602, a signal control portion 603, a first signal transfer portion T601, a second signal transfer portion T602, a third signal transfer portion T603, a latch portion L604, a first delay portion D601, a second delay portion D602, and an output portion 604.

The power signal transfer portion 601 receives the power up signal PWRUP to output an inverted power up signal. The power signal transfer portion 601 can be preferably implemented with an inverter I609 whose input terminal is coupled to a ground, and a NAND gate ND601 for NANDing an output signal from the inverter I609 and the power up signal PWRUP.

The write command input portion 602 receives the write command signals RAS, /CAS, /WE and /CS. At this time, in case where all the write command signals RAS, /CAS, /WE and /CS is high, a high level signal is outputted as an output signal of the write command input portion 602.

As an embodiment, a structure of the write command input portion 602 is as follows.

The chip select bar signal /CS is inputted to a gate of a PMOS transistor P601 whose source is coupled to the power terminal, and the row address strobe signal RAS is inputted to a gate of an NMOS transistor N601 whose drain is coupled to a drain of the PMOS transistor P601. The column address strobe bar signal /CAS is inputted to an NMOS transistor N602 whose drain is coupled to a source of the NMOS transistor N601. The write enable bar signal /WE is inputted to a gate of an NMOS transistor N603 whose drain is coupled to a source of the NMOS transistor N602. The chip select bar signal /CS is also inputted to a gate of an NMOS transistor N604 whose drain is coupled to a source of the NMOS transistor N603 and whose source is coupled to the ground terminal.

At this time, an output signal from the drain of the PMOS transistor P601 is inverted by an inverter I601 and an inverted signal from the inverter I601 is inputted to a PMOS transistor P602 whose source is coupled to the power terminal and whose drain is coupled to the drain of the PMOS transistor P601. At this time, the output signal from the inverter I601 corresponds to an output signal of the write command input portion 602.

The control clock signal CLK_LW and an inverted output signal from the second signal transfer portion T602 are NANDed by a NAND gate ND602. An output signal from the NAND gate ND602 is inputted to the signal control portion 603.

In the signal control portion 603, the output signal from the NAND gate ND602 is inputted to a gate of a PMOS transistor P603 whose source is coupled to the power terminal. The output signal from the inverter I601 is inputted to a gate of a PMOS transistor P604 whose source is coupled to a drain of the PMOS transistor P604. The output signal from the inverter I601 is also inputted to a gate of an NMOS transistor N605 whose drain is coupled to a drain of the PMOS transistor P604 and whose source is coupled to the ground terminal. Furthermore, the power up signal PWRUP is inputted to a PMOS transistor P605 whose source is coupled to the power terminal and whose drain is coupled to the drain of the PMOS transistor P604.

In the first signal transfer portion T601, the output signal from the drain of the PMOS transistor P605 is latched into a latch circuit L601 and inverted by an inverter I605. Then, a pass gate receives an inverted signal from the inverter I605 and outputs the inverted signal in response to the control clock signal CLK_LW.

In the second signal transfer portion T602, an output signal from the first signal transfer portion T601 is latched into a latch circuit L602 and inverted by an inverter I608. Then, a pass gate G602 receives an inverted signal from the inverter I608 and outputs the inverted signal in response to the control clock signal CLK_LW.

In the third signal transfer portion T603, a latch circuit L603 is activated in response to an output signal from the NAND gate ND601 and latches an output signal from the second signal transfer portion T602. An output signal from the latch circuit L603 is inverted by an inverter I611 and then, a pass gate G603 transmits an inverted signal from the inverter I611 in response to the control clock signal CLK_LW.

The latch portion L604 is activated in response to the inverted power up signal from the NAND gate ND601 to latch an output signal from the third signal transfer portion T603.

The first delay portion D601 delays an output signal from the latch portion L604 for a predetermined time to generate the initial CAS active signal CASATV_WT_PRE.

The second delay portion D602 delays the output signal from the signal control portion 603 for a predetermined time.

The output signal from the signal control portion 603, an output signal from the second delay portion D602 and the output signal from the second signal transfer portion T602 are NANDed through a NAND gate ND603.

An output signal from the NAND gate ND603 and an output signal from the first delay portion D601 is NORed through a NOR gate NOR603. An output signal from the NOR gate NOR603 is inverted by an inverter I620 to generate the write standby signal WT_STDBY.

As shown in FIG. 11, in case where the write command signals are activated to a high level, the NMOS transistors N601 to N604 are turned on, so that the drain of the NMOS transistor N601 becomes low and the output signal of the write command input portion 602 becomes high. Therefore, the NMOS transistor N605 is turned on, so that the signal at the drain of the NMOS transistor N605 becomes low. The signal at the drain of the NMOS transistor N605 is transferred through the signal transfer portions T601, T602 and T603 to the latch portion L604. The transferred signal is then latched into the latch portion L604 and delayed through the first delay portion D601 and outputted as the initial CAS active signal CASATV_WT_PRE.

Then, in case where the chip select bar signal /CS becomes low, the output signal from the write command input portion 602 becomes low, so that the initial CAS active signal CASATV_WT_PRE is outputted every when the control clock signal CLK_LW is low.

Meanwhile, the write standby signal WT_STDBY is outputted in response to the output signal from the second signal transfer portion T602 and the initial CAS active signal CASATV_WT_PRE.

Figure 7:
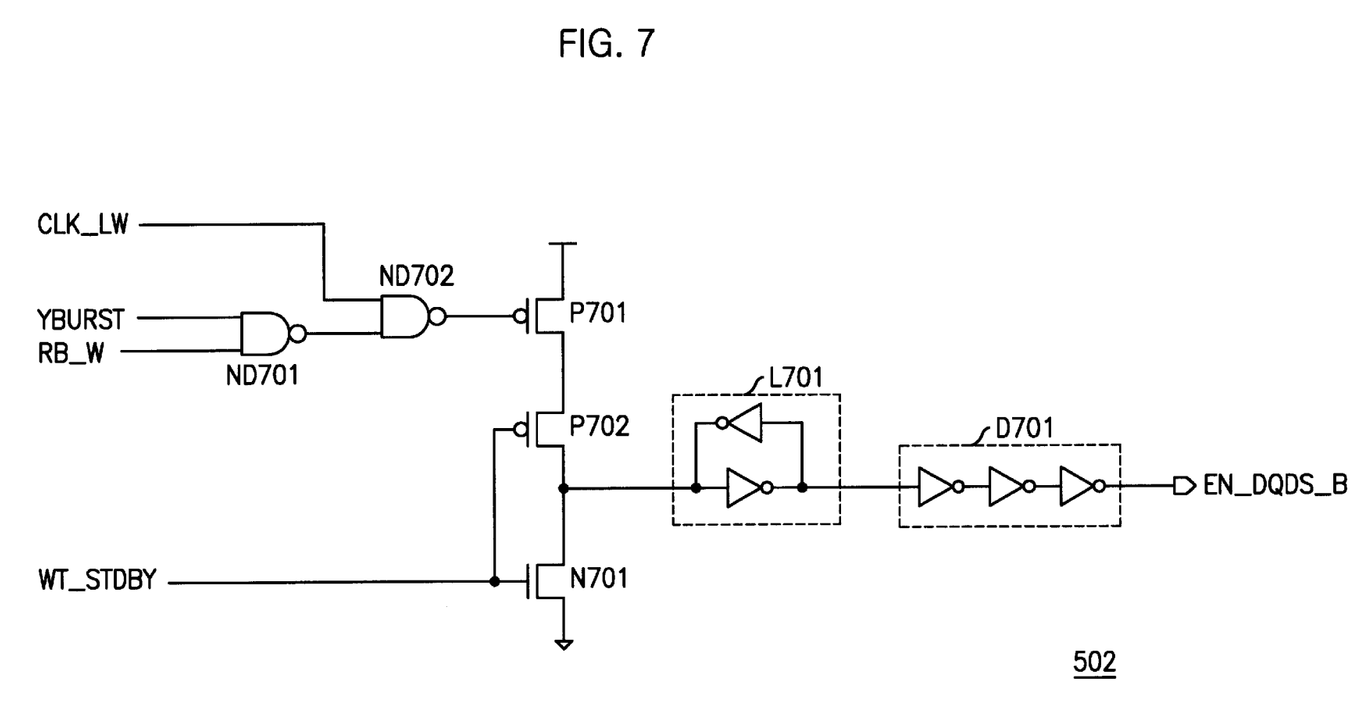
FIG. 7 is a circuit diagram illustrating a second control unit shown in FIG. 5.

In FIG. 7, there is shown a circuit diagram of the second control signal generating unit 502 shown in FIG. 5.

Referring to FIGS. 7 and 11, the column burst signal YBURST and the write control signal RB_W are NANDed by a NAND gate ND701. The control clock signal CLK_LW and an output signal from the NAND gate ND701 are NANDed by a NAND gate ND702. An output signal from the NAND gate ND702 is inputted to a gate of a PMOS transistor P701, whose source is coupled to a power terminal. The write standby signal WT_STDBY is inputted to a gate of a PMOS transistor P702 whose source is coupled to a drain of the PMOS transistor P701, and a gate of an NMOS transistor N701 whose drain is coupled to a drain of the PMOS transistor P702 and whose source is coupled to the ground terminal.

Furthermore, a latch circuit L701 latches and outputs an output signal from the drain of the PMOS transistor P702. An inversion and delay portion D701 inverts and delays an output signal from the latch portion L701 for a predetermined time to output an inverted and delayed signal as an input path enable signal EN_DQDS_B. The inversion and delay portion D701 can be implemented with a predetermined odd number of inverters coupled in series to each other.

As shown in FIG. 11, in case where the write standby signal WT_STDBY is high, the input path enable signal EN_DQDS_B becomes low. On the other hand, in case where the write standby signal WT_STDBY is low and either the column burst signal YBURST or the write control signal RB_W is low, the input path enable signal EN_DQDS_B becomes high when the control clock signal CLK_LW is high.

Figure 8:
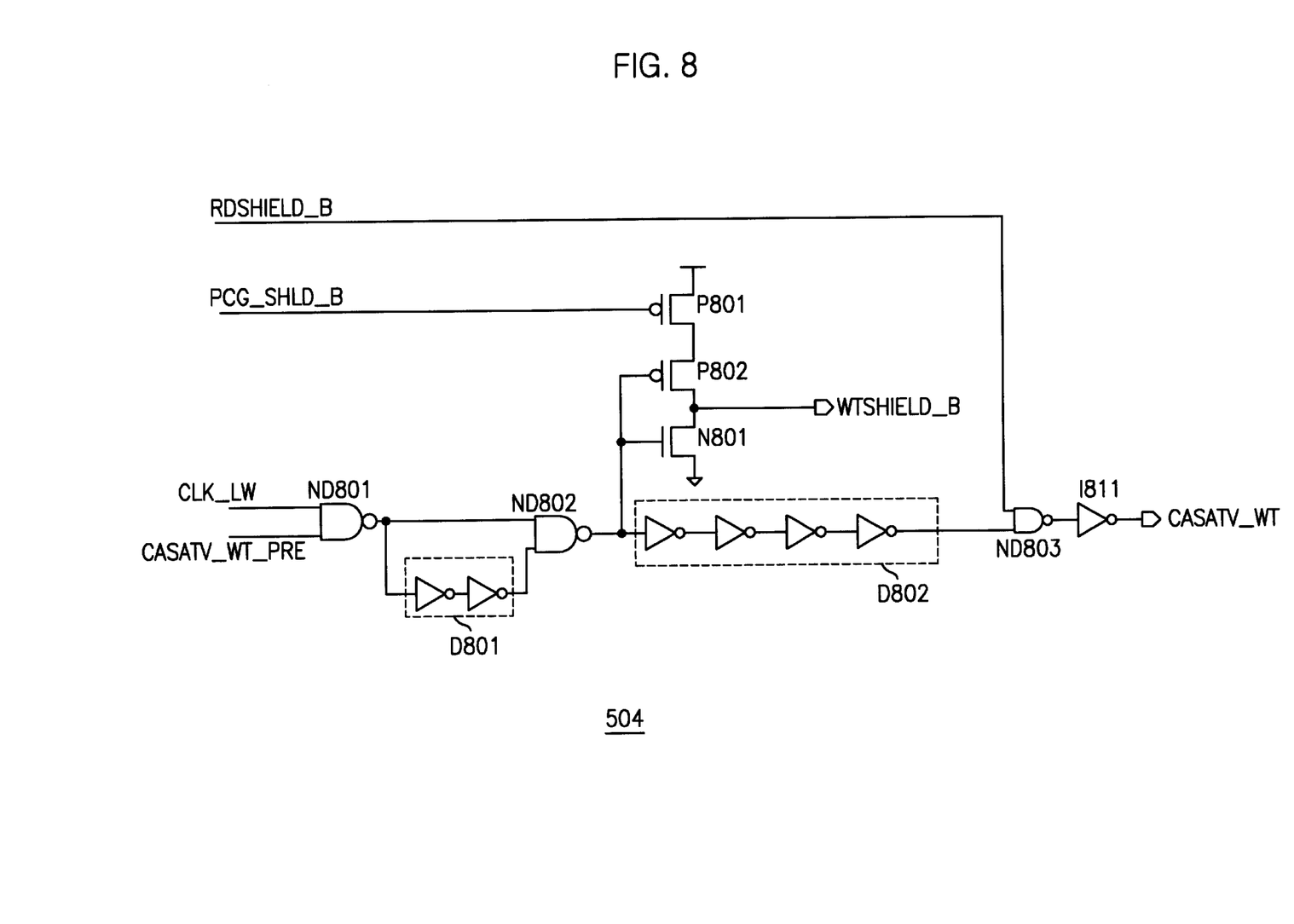
FIG. 8 is a circuit diagram illustrating a third control unit shown in FIG. 5.

In FIG. 8, there is shown a circuit diagram of the third control signal generating unit 504 shown in FIG. 5.

Referring to FIG. 8, the control clock signal CLK_LW and the initial CAS active signal CASATV_WT_PRE are NANDed by a NAND gate ND801. An output signal from the NAND gate ND801 is delayed for a predetermined time by a delay unit D801. The output signal from the NAND gate ND801 and an output signal from the delay unit D801 are NANDed by a NAND gate ND802.

The precharge shield bar signal PCG_SHLD_B is inputted to a gate of a PMOS transistor P801 whose source is coupled to the power terminal. An output signal from the NAND gate ND802 is inputted to a gate of a PMOS transistor P802 whose source is coupled to a drain of the PMOS transistor P801. The output signal from the NAND gate ND802 is also inputted to a gate of a NMOS transistor P801 whose drain is coupled to a drain of the PMOS transistor P802 and whose source is coupled to the ground terminal. At this time, the write shield bar signal WTSHIELD_B is outputted from the drain of the PMOS transistor P802.

A delay portion D802 delays the output signal from the NAND gate ND802 for a predetermined time to output a delayed signal. The delay portion D802 can be implemented with a predetermined even number of inverters coupled in series to each other. The delayed signal from the delay portion D802 and the read shield bar signal RDSHIELD_B are NANDed by a NAND gate ND803. An output signal from the NAND gate ND803 is inverted through an inverter I811 to output the write CAS active signal CASATV_WT.

As shown in FIG. 11, in case where the precharge shield bar signal PCG_SHLD_B is high, the write shield bar signal WTSHIELD_B is generated in response to the initial CAS active signal CASATV_WT_PRE from the first control signal generating unit 500 and the control clock signal CLK_WT. Additionally, in case where the read shield bar signal RDSHIELD_B is high, the write CAS active signal CASATV_WT is generated in response to the initial CAS active signal CASATV WT_PRE and the control clock signal CLK_WT.

Figure 9:
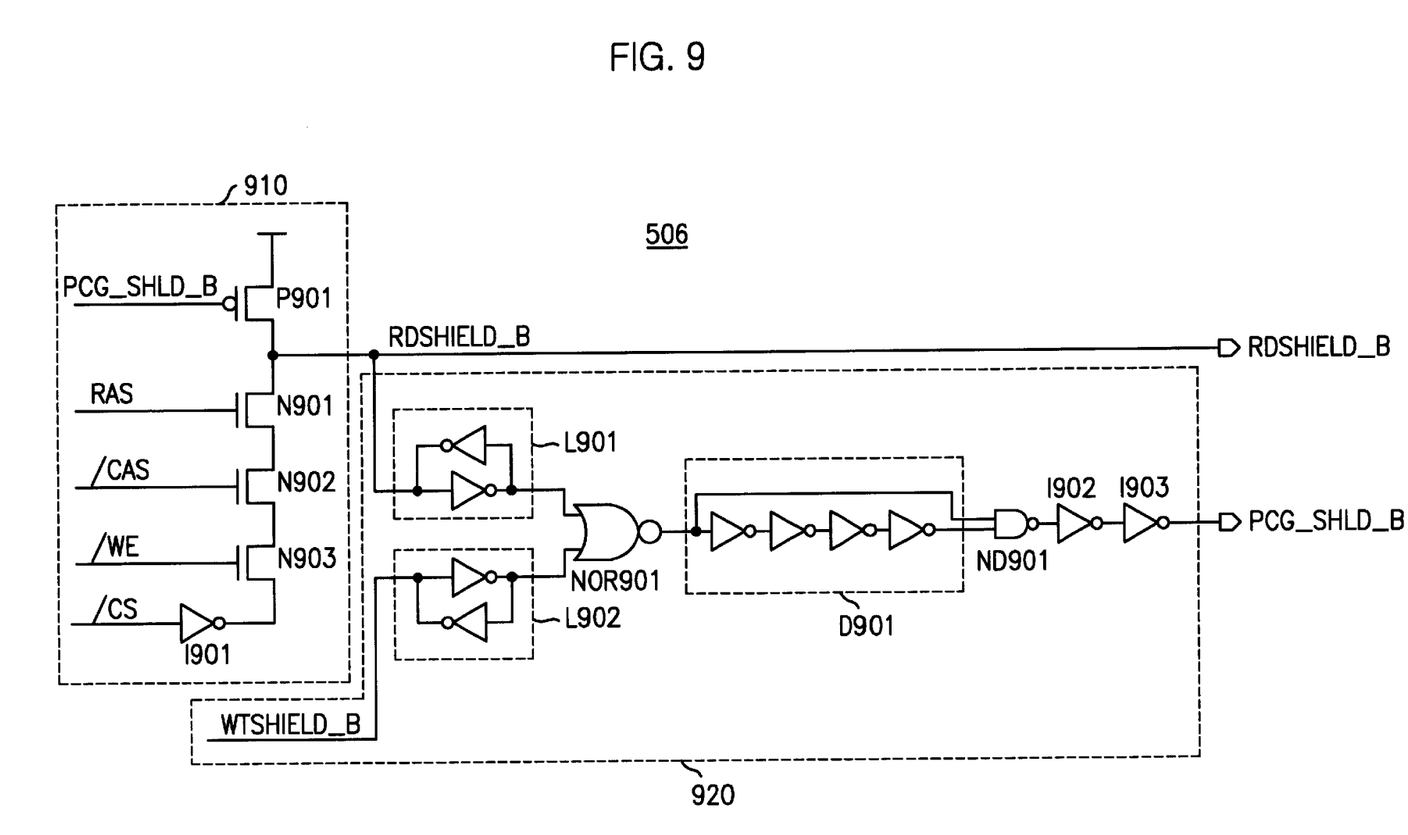
FIG. 9 is a circuit diagram illustrating a fourth control unit shown in FIG. 5.

In FIG. 9, there is shown a circuit diagram of the fourth control signal generating unit 506 shown in FIG. 5.

Referring to FIG. 9, the fourth control signal generating unit 505 includes a read shield bar signal generating portion 910 and a precharge shield bar signal generating portion 920.

In the read shield bar signal generating portion 910, the precharge shield bar signal RDSHIELD_B is inputted to a gate of a PMOS transistor P901 whose source is coupled to the power terminal. The row address strobe signal RAS is inputted to a gate of an NMOS transistor N901 whose drain is coupled to a drain of the PMOS transistor P901. The column address strobe bar signal /CAS is inputted to a gate of an NMOS transistor N902 whose drain is coupled to a source of the NMOS transistor N901. The write enable bar signal /WE is inputted to a gate of an NMOS transistor N903 whose drain is coupled to a source of the NMOS transistor N902 and whose source is coupled to an output terminal of an inverter I901 for inverting the chip select bar signal /CS. At this time, the read shield bar signal RDSHIELD_B is outputted from the drain of the PMOS transistor P901.

In the precharge shield bar signal generating portion 920, the read shield bar signal RDSHIELD_B and the write shield bar signal WTSHIELD_B are latched into latch circuits L901 and L902, respectively. Latched read shield bar signal RDSHIELD_B and latched write shield bar signal WTSHIELD_B are NORed by a NOR gate NOR901. An output signal from the NOR gate NOR901 is delayed by a delay unit D901, wherein the delay unit 901 is implemented by a predetermined even number of inverters coupled in series to each other. An output signal from the delay unit D901 and the output signal from the NOR gate NOR901 is NANDed by a NAND gate ND901. An output signal from the NAND gate ND901 is passed through inverters I902 and I903 to generate the precharge shield bar signal PCG_SHLD_B.

As shown in FIG. 11, in case where all the write command signals RAS, /CAS, /WE and /CS are high, the read shield bar signal RDSHIELD_B is initialized to a low level. Then, when all the write command signals RAS, /CAS, /WE and /CS are low, the read shield bar signal RDSHIELD_B is generated in response to the precharge shield bar signal PCG_SHLD_B.

In case where either the read shield bar signal RESHIELD_B or the write shield bar signal WTSHIELD_B is low, the precharge shield bar signal PCG_SHLD_B is generated to a low level.

Figure 10:
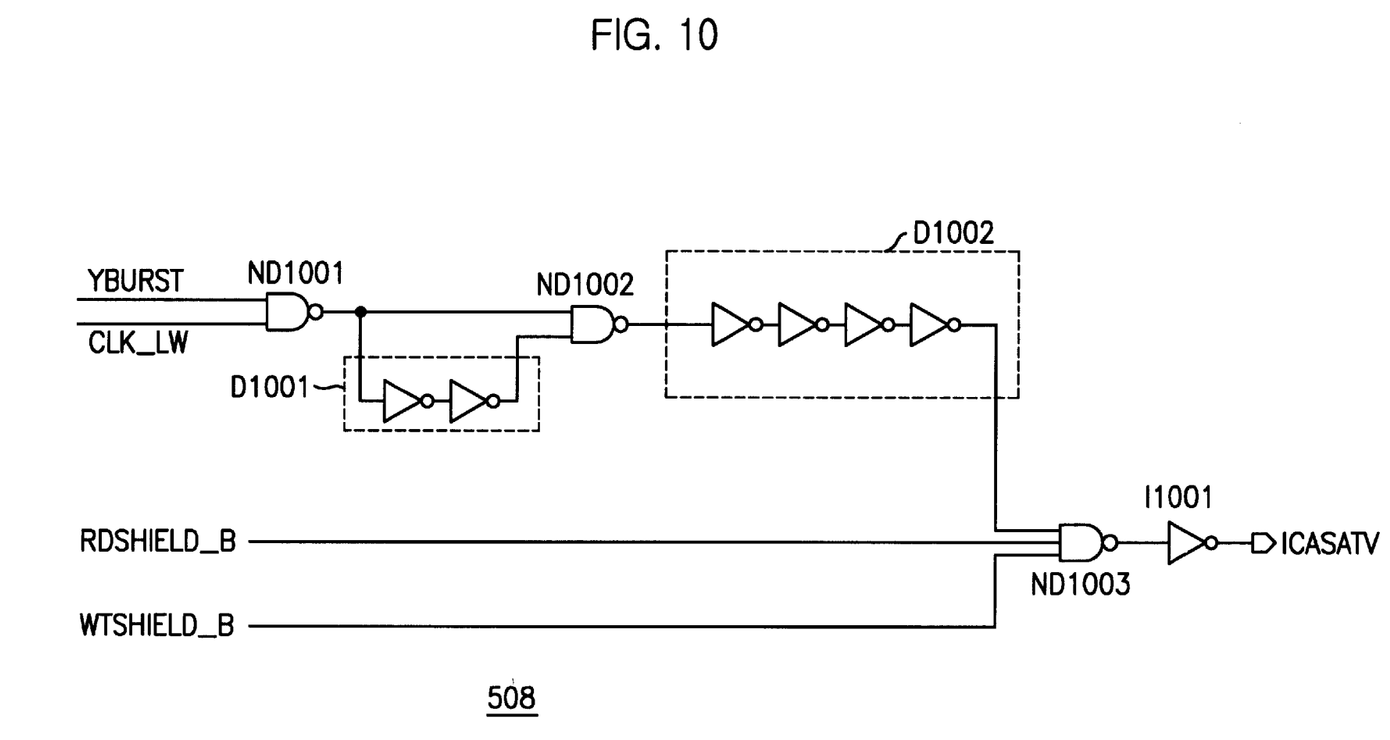
FIG. 10 is a circuit diagram illustrating a fifth control unit shown in FIG. 5.
Figure 11:
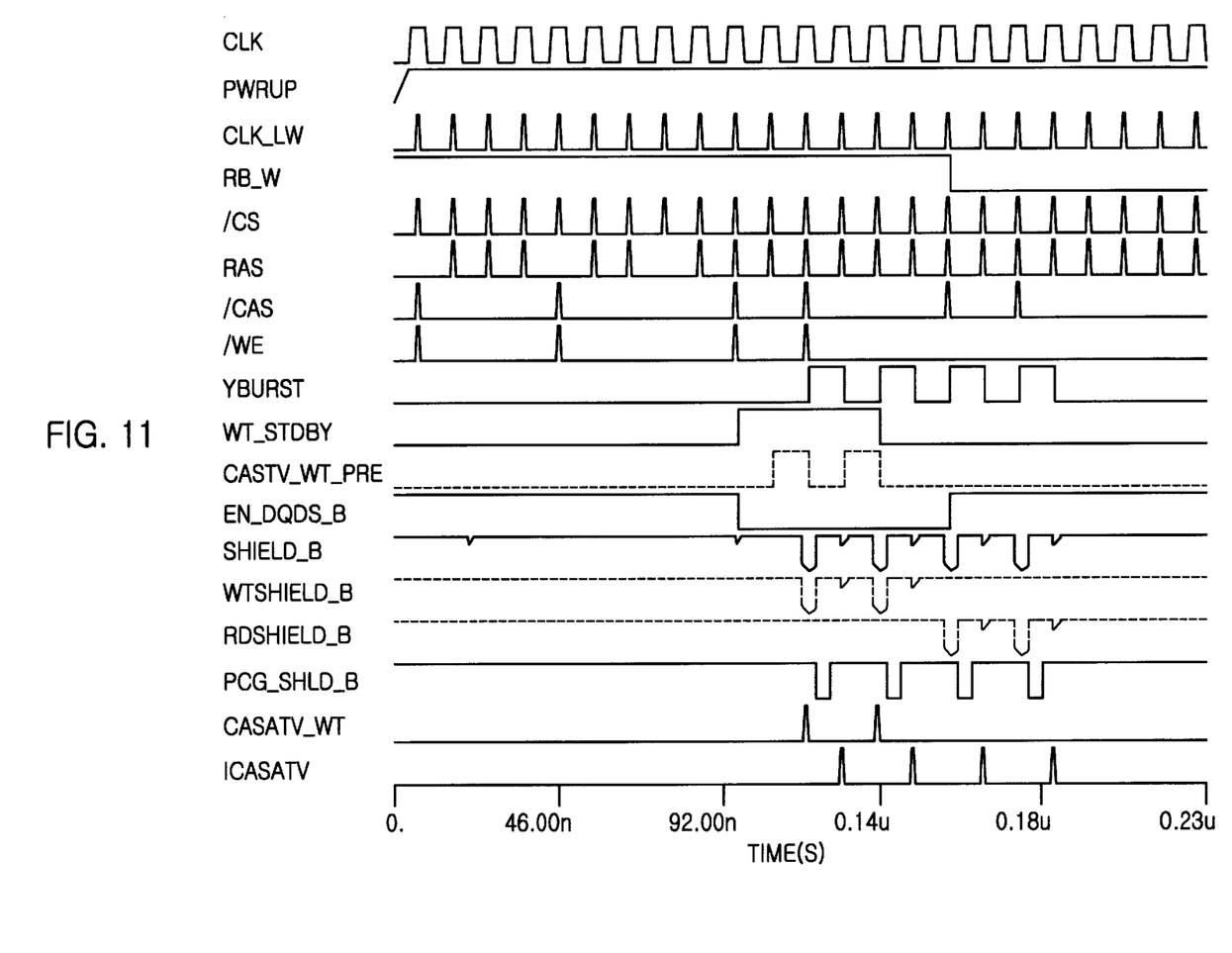
FIG. 11 a timing chart of signals shown in FIG. 5.

In FIG. 10, there is shown a circuit diagram of the fifth control signal generating unit 508 shown in FIG. 5.

Referring to FIG. 10, the column burst signal YBURST and the control clock signal CLK_LW are NANDed by a NAND gate ND1001. A delay unit D1001 delays an output signal from the NAND gate ND1001 to generate a delayed signal. The output signal from the NAND gate ND1O01 and the delayed signal from the delay unit D1001 are NANDed by a NAND gate ND1002. Then, an output signal from the NAND gate ND1002 is delayed by a delay unit D1002.

An output signal form the delay unit D1002, the read shield bar signal RDSHIELD_B and the write shield bar signal WTSHIELD_B are NANDed by a NAND gate ND1003. An output signal is inverted by an inverter I1001 to generate the internal CAS active signal ICASATV.

As shown in FIG. 11, in case where the control clock signal CLK_LW, the read shield bar signal RDSHIELD_B, and the write shield bar signal WTSHIELD_B is high, the internal CAS active signal ICASATV is generated in response to the column burst signal YBURST.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for generating internal write control signals applicable to a double data rate SDRAM, comprising:

a first means for receiving write command signals to generate a write standby signal and an initial column address strobe (CAS) active signal, wherein the write command signal includes a row address strobe (RAS) signal, a column address strobe (CAS) bar signal, a write enable (WE) bar signal, and a chip select (CS) bar signal;

a second means for receiving the write standby signal to generate an input path enable signal;

a third means for receiving the initial CAS (column address strobe) active signal to generate a write CAS active signal and a write shield bar signal;

a fourth means for receiving the write command signals and the write shield bar signal to generate a precharge shield bar signal and a read shield bar signal, wherein the precharge shield bar signal is fed back to an input terminal of the fourth means and is inputted as another input signal of the second means; and a fifth means for receiving the write shield bar signal and the read shield bar signal to generate an internal CAS active signal.

2. The apparatus as recited in claim 1, wherein the first means includes:

a power signal transfer means for transferring a power up signal representing a power is turned on;

a write command input means for receiving the write command signals;

a signal control means operative to an output signal from the write command input means and a control clock signal;

a first signal transfer means for transferring an output signal from the signal control means in response to the control clock signal;

a second signal transfer means for transferring an output signal from the first signal transfer means in response to the control clock signal;

a third signal transfer means for transferring an output signal from the second signal transfer means in response to the control signal;

a latch means for latching and outputting an output signal from the third signal transfer means;

a first delay means for delaying an output signal from the latch means for a predetermined time, to output the initial CAS active signal;

a second delay means for delaying the output signal from the signal control means for a predetermined time; and an output means for receiving the output signal from the signal control, an output signal from the second delay means and the output signal from the second signal transfer means, to generate the write standby signal.

3. The apparatus as recited in claim 2, wherein the write command signal input means includes:

a first PMOS transistor having a source coupled to a power terminal and a gate receiving the chip select bar signal;

a first NMOS transistor having a drain coupled to a drain of the first PMOS transistor and a gate receiving the row address strobe signal;

a second NMOS transistor having a drain coupled to a source of the first AMOS transistor and a gate receiving the column address strobe bar signal;

a third NMOS transistor having a drain coupled to a source of the second NMOS transistor and a gate receiving a write enable bar signal;

a fourth NMOS transistor having a drain coupled to a source of the third NMOS transistor, a source coupled to a ground terminal, and a gate receiving the chip select bar signal;

an inverter having an input terminal coupled to the drain of the first PMOS transistor; and a second PMOS transistor having a source coupled to the power terminal, a drain coupled to the drain of the first PMOS transistor and a gate coupled to an output terminal of the inverter and a gate.

4. The apparatus as recited in claim 3, wherein the signal control means includes:

a NAND gate for NANDing a control clock signal and an output signal from the second signal transfer means;

a first PMOS transistor having a source coupled to the power terminal and a gate receiving an output signal from the NAND gate;

a second PMOS transistor having a source coupled to a drain of the first PMOS transistor and a gate receiving an output signal from the write command input means;

a third PMOS transistor having a source coupled to the power terminal, a drain coupled to a drain of the second PMOS transistor and a gate receiving the power up signal; and an NMOS transistor having a drain coupled to the drain of the second PMOS transistor, a source coupled to a ground terminal, and a gate receiving the output signal from the write command input means.

5. The apparatus as recited in claim 4, wherein the first signal transfer means includes:

a latch circuit for latching an output signal from the signal control means;

a second inverter for inverting an output signal from the latch circuit; and a pass gate for receiving and outputting an output signal from the inverter in response to the control clock.

6. The apparatus as recited in claim 5, wherein the second signal transfer means includes:

a second latch circuit for latching an output signal from the first signal transfer means;

a third inverter for inverting an output signal from the second latch circuit; and a second pass gate for receiving and outputting an output signal from the third inverter in response to the control clock.

7. The apparatus as recited in claim 6, wherein the third signal transfer means includes:

a third latch circuit for latching an output signal from the second signal transfer means in response to the power up signal;

a fourth inverter for inverting an output signal from the third latch circuit; and a third pass gate for transferring an output signal from the fourth inverter in response to the control clock signal.

8. The apparatus as recited in claim 7, wherein the latch means includes:

a first NOR gate having a first input terminal receiving an output signal from the third signal transfer means and a second input terminal receiving the power up signal; and a fifth inverter having an input terminal coupled to an output terminal of the NOR gate and an output terminal coupled to the first input terminal of the NOR gate.

9. The apparatus as recited in claim 8, wherein the first delay means includes:

a plurality of inverters coupled in series, for delaying an output signal from the latch means for a predetermined time, to output the initial CAS active signal.

10. The apparatus as recited in claim 8, wherein the second delay means includes:

a plurality of inverters coupled in series, for delaying the output signal from the signal control means for a predetermined time.

11. The apparatus as recited in claim 10, wherein the output means includes:

a NAND gate for NANDing the output signal from the signal control means, an output signal from the second delay means and the output signal from the second signal transfer means;

a second NOR gate for NORing an output signal from the NAND gate and the initial CAS active signal, to generate the write standby signal.

12. The apparatus as recited in claim 1, wherein the second means includes:

a first NAND gate for NANDing a column burst signal and a write control signal;

a second NAND gate for NANDing the control clock signal and an output signal from the first NAND gate;

a first PMOS transistor having a source coupled to a power terminal and a gate receiving an output signal from the second NAND gate;

a second PMOS transistor having a source coupled a drain of the first PMOS transistor and a gate receiving the write standby signal;

an NMOS transistor having a drain coupled to a drain of the second PMOS transistor, a source coupled to a ground terminal, and a gate receiving the write standby signal;

a latch circuit for latching a signal outputted through the drain of the second PMOS transistor; and a predetermined odd number of inverters for inverting and delaying an output signal from the latch circuit, to generate the input path enable signal.

13. The apparatus as recited in claim 1, wherein the third means includes:

a first NAND gate for NANDing the control clock signal and the initial CAS active signal;

a delay unit for delaying an output signal from the NAND gate for a predetermined time;

a second NAND gate for NANDing and output signal from the first NAND gate and an output signal from the delay unit;

a first PMOS transistor having a source coupled to a power terminal and a gate receiving the precharge shield bar signal;

a second PMOS transistor having a source coupled to a drain of the first PMOS transistor, a gate receiving an output signal from the second NAND gate;

an NMOS transistor having a drain coupled to a drain of the second PMOS transistor, a source coupled to a ground terminal and a gate receiving the output signal from the second NAND gate, wherein the write shield bar signal is outputted through the drain of the second PMOS transistor;

a delay unit for delaying an output signal from the second NAND gate for a predetermined time;

a third NAND gate for NANDing the read shield bar signal and an output signal from the delay unit; and an inverter for inverting an output signal from the third NAND gate, to generate the write CAS active signal.

14. The apparatus as recited in claim 1, wherein the fourth means includes:

a first signal generating means for receiving the write command signals to generate the read shield bar signal in response to the precharge shield bar signal; and a second signal generating means for receiving the read shield bar signal and the write shield bar signal to generate the precharge shield bar signal.

15. The apparatus as recited in claim 14, wherein the first signal generating means includes:

a PMOS transistor having a source coupled to a power terminal and a gate receiving the precharge shield bar signal;

a first NMOS transistor having a drain coupled to a drain of the PMOS transistor and a gate receiving a row address strobe signal, wherein the read shield bar signal is outputted through the drain of the PMOS transistor;

a second transistor having a drain coupled to a drain of the first NMOS transistor and a gate receiving a column address strobe bar signal;

a third transistor having a drain of the second transistor, a gate receiving the write enable bar signal and a source receiving a chip select signal.

16. The apparatus as recited in claim 15, wherein the second signal generating means includes:

a first latch circuit for latching the read shield bar signal;

a second latch circuit for latching the write shield bar signal;

a NOR gate for NORing an output signal from the first latch circuit and an output signal from the second latch circuit;

a delay unit for delaying an output signal from the NOR gate for a predetermined time; and a NAND gate for NANDing the output signal from the NOR gate and an output signal from the delay unit, to generate the precharge shield bar signal.

17. The apparatus as recited in claim 1, wherein the fifth means includes:

a first NAND gate for NANDing a column burst signal and a control clock signal;

a first delay unit for delaying an output signal from the NAND gate for a predetermined time;

a second NAND gate for NANDing the output signal from the NAND gate and an output signal from the delay unit;

a second delay unit for delaying an output signal from the second NAND gate for a predetermined time; and a third NAND gate for NANDing an output signal from the second delay unit, the read shield bar signal and the write shield bar signal, to generate the internal CAS active signal.

* * * * *